United States Patent [19]

Zharov et al.

[11] Patent Number: 5,691,065

[45] Date of Patent: Nov. 25, 1997

[54] POLYMERIZABLE COMPOSITIONS MADE WITH POLYMERIZATION INITIATOR SYSTEMS BASED ON ORGANOBORANE AMINE COMPLEXES

[75] Inventors: Jury V. Zharov, Nizhny Novgorod; Jury N. Krasnov, deceased, late of Nizhny Novgorod, both of Russian Federation, by Julia A. Krasnova, Legal Representative

[73] Assignee: Minnesota Mining and Manufacturing Company, St. Paul, Minn.

[21] Appl. No.: 612,035

[22] Filed: Mar. 7, 1996

Related U.S. Application Data

[62] Division of Ser. No. 391,642, Feb. 21, 1995, Pat. No. 5,539,070.

[51] Int. Cl.$^6$ .............................. B32B 27/32; B32B 27/30
[52] U.S. Cl. .......................... 428/421; 428/422; 428/518; 428/515; 428/520; 428/500
[58] Field of Search .................................. 428/421, 422, 428/518, 522, 523, 500, 515, 520

[56] References Cited

U.S. PATENT DOCUMENTS

| | | | |
|---|---|---|---|
| 2,985,633 | 5/1961 | Welch et al. | 260/85.3 |
| 3,141,862 | 7/1964 | Kirshenbaum et al. | 260/45.5 |
| 3,275,611 | 9/1966 | Mottus et al. | 260/80.5 |
| 3,340,193 | 9/1967 | Fields et al. | 252/56 |
| 3,418,260 | 12/1968 | Trofimenko | 260/2 |
| 3,425,988 | 2/1969 | German et al. | 260/47 |
| 3,451,952 | 6/1969 | Slocombe | 260/2.5 |
| 3,476,727 | 11/1969 | Lo Monaco et al. | 260/92.8 |
| 3,527,737 | 9/1970 | Masuhara et al. | 260/78.5 |
| 3,829,973 | 8/1974 | Masuhara et al. | 32/15 |
| 4,167,616 | 9/1979 | Bollinger | 526/197 |
| 4,515,724 | 5/1985 | Ritter | 260/410 |
| 4,638,092 | 1/1987 | Ritter | 568/1 |
| 4,639,498 | 1/1987 | Ritter | 526/196 |
| 4,676,858 | 6/1987 | Ritter | 156/307.3 |
| 4,920,188 | 4/1990 | Sakashita et al. | 526/196 |
| 4,921,921 | 5/1990 | Ritter | 526/195 |
| 4,985,516 | 1/1991 | Sakashita et al. | 526/196 |
| 5,106,928 | 4/1992 | Skoultchi et al. | 526/196 |
| 5,143,884 | 9/1992 | Skoultchi et al. | 502/160 |
| 5,286,821 | 2/1994 | Skoultchi | 526/196 |
| 5,310,835 | 5/1994 | Skoultchi et al. | 526/198 |
| 5,376,746 | 12/1994 | Skoultchi | 526/196 |
| 5,401,805 | 3/1995 | Chung et al. | 525/288 |

FOREIGN PATENT DOCUMENTS

| | | | |
|---|---|---|---|
| 2061021 | 10/1992 | Canada | C09D 157/00 |
| 46-16888 | 5/1971 | Japan | B01J 000/00 |
| 48-18928 | 6/1973 | Japan | C09J 5/00 |
| 53-102394 | 9/1978 | Japan | C08F 4/40 |
| 62-288675 | 12/1987 | Japan | C09J 3/14 |
| 3-177470 | 8/1991 | Japan . | |
| 3-264509 | 11/1991 | Japan | A61K 6/00 |
| 5-235089 | 9/1993 | Japan | A61K 6/00 |
| 1113722 | 5/1968 | United Kingdom | C08F 1/28 |
| 1132261 | 10/1968 | United Kingdom | C08F 1/84 |

OTHER PUBLICATIONS

The Trialkylborane–initiated Graft Copolymerization of Methyl Methacrylate onto Hemoglobin, K. Kojima, S. Iwabuchi and K. Kojima, *Bulletin of the Chemical Society of Japan*, vol. 44, pp. 1891–1895 (1971).

A New Method for the Graft Copolyermerization of Methyl Methacrylate onto Proteins and Fibers, *Polymer Letters*, vol. 9, pp. 25–29 (1971).

The Grafting of Methyl Methacrylate onto Cotton by Tri–n–butylborane, K. Kojima, S. Iwabuchi, K. Murakami, K. Kojima and F. Ichikawa, *Journal of Applied Polymer Science*, vol. 16, pp. 1139–1148 (1972).

Grafting of Vinyl Monomers by Tri–n–butylborane onto Chlorophyll and Related Compounds, *Polymer Letters Edition*, vol. 13, pp. 361–363 (1975).

Tributylborane–Initiated Grafting of Methyl Methacrylate onto Chitin, K. Kojima, M. Yoshikuni and T. Suzuki, *Journal of Applied Polymer Science*, vol. 24, pp. 1587–1593 (1979).

Grafting of Methyl Methacrylate onto Silk Fibers Initiated by Tri–n–Butylborane, M. Tsukada, T. Yamamoto, N. Nakabayashi, H. Ishikawa and G. Freddi, *Journal of Applied Polymer Science*, vol. 43, pp. 2115–2121 (1991).

Molecular Weight Distribution of Methyl Methacrylate (MMA) Polymer Separated from the MMA–Grafted Silk Fiber, M. Tsukada, Y. Goto, G. Freddi, T. Yamamoto and N. Nakabayashi, *Journal of Applied Polymer Science*, vol. 44, pp. 2197–2202 (1992).

(List continued on next page.)

Primary Examiner—Mark Nagumo
Attorney, Agent, or Firm—Gary L. Griswold; Walter N. Kirn; Steven E. Skolnick

[57] ABSTRACT

A polymerizable acrylic composition comprises:
(a) at least one acrylic monomer;
(b) an effective amount of an organoborane amine complex having the structure:

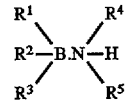

wherein:
$R^1$ is an alkyl group having 1 to 10 carbon atoms;
$R^2$ and $R^3$ are independently selected from phenyl-containing groups and alkyl groups having 1 to 10 carbon atoms;
Rhu 4 is selected from the group consisting of $CH_2CH_2OH$ and $(CH_2)_xNH_2$ wherein x is an integer greater than 2;
$R^5$ is hydrogen or an alkyl group having 1 to 10 carbon atoms; and
the nitrogen atom to boron atom ratio is about 1:1 to 1.5:1; and
(c) an effective amount of an acid for initiating polymerization of the acrylic monomer.

The polymerizable acrylic compositions are especially useful for bonding low surface energy substrates.

20 Claims, No Drawings

OTHER PUBLICATIONS

Synthesis of Functionalized Polypropylene and Polypropylene–Polymethylmethacrylate Graft Copolymer, D. Rhubright and T.C. Chung, Proceedings of the American Chemical Society, *Polymeric Materials Science and Engineering*, vol. 67, pp. 112–113 (1992).

Polymerization of Acrylonitrile in Presence of Tributylborine, G. Kolesnikov and L. Fedorova, translated from *Bull. Acad. Sci. USSR, Div. Chem. Sci.*, p. 236 (1957).

Tributylborine: A Catalyst for the Polyermization of Unsaturated Compounds, G. Kolesnikov and N.V. Klimentova, translated from *Bull Acad. Sci. USSR, Div. Chem. Sci.*, p. 653 (1957).

Triethylboron as an Initiator for Vinyl Polymerization, J. Furukawa, T. Tsuruta and S. Inoue, *Journal of Polymer Science*, vol. XXVI, Issue No. 113, pp.234–236 (1957).

Oxygen Compounds as Cocatalyst for Triethylboron–Catalyzed Vinyl Polymerization, J. Furukawa and T. Tsuruta, *Journal of Polymer Science*, vol. XXVIII, Issue No. 116, pp. 227–229 (1958).

Mechanism of the Polymerization of Acrylonitrile in Presence of Tributylborine, G. Kolesnikov and L. Fedorova, translated from *Bull. Acad. Sci. USSR, Div. Chem. Sci.*, p. 906 (1958).

Mechanism of Trialkylboron Initiated Polymerization, J. Fordham and C. Sturm, *Journal of Polymer Science*, vol. XXXIII, No. 126, pp. 503–504 (1958).

Cocatalytic Activity of Some Metal Salts on Vinyl Polmerization with Tributhylboron, I. M. Panayotov, *Comptes rendus de l'Academie bulgare des Sciences*, vol. 14, No. 2, pp. 147–150 (1961).

Polymerization with Organoboron Compounds, F. Arimoto, *Journal of Polymer Science: Part A–1*, vol. 4, pp. 275–282 (1966).

On the Existence of a Free–Radical Organoboron Complex in the Polymerization of Methyl Methacrylate, R. Kern and J. Schaefer, *Polymer Letters*, vol. 5, pp. 157–162 (1967).

Vinyl Monomer Polymerization Mechanism in the Presence of Trialkylboranes, J. Grotewold, E. Lissi and A. Villa, *Journal of Polymer Science: Part A–1*, vol. 6, pp. 3157–3162 (1968).

Free–Radical Polymerization of Methyl Methacrylate in the Presence of Trialkylboranes, P. Brindley and R. Pearson, *Polymer Letters*, vol. 6, pp. 831–835 (1968).

Ethylene Polymerization in Presence of Tributylboron, G. Kolesnikov and T. Soboleva, *Scientific and Research Publications of the Members of the All Union Chemical Society Name After Mendilev*, vol. 2, p. 663 (1957).

Studies on Dental Self–Curing Resins (II), S. Fujisawa, Y. Imai and E. Masuhara, *Reports of the Institute for Medical & Dental Engineering*, vol. 3, pp. 64–71 (1969).

Free–Radical Copolymerization of 1,2–Dichloroethylenes. Evidence for Chain Transfer by Chlorine Atom Elimination, T. Dawson, R. Lundberg and F. Welch, *Journal of Polymer Science: Part A–1*, vol. 7, pp. 173–181 (1969).

Mechanism of Vinyl Monomer Polymerization in the Presence of Trialkylboranes and Inhibitors, E. Aranchibia et al., *Journal of Polymer Science: Part A–1*, vol. 7, pp. 3430–3433 (1969).

Polymerization of Methyl Methacrylate by Trialkylborane–Pyridine System, K. Kojima et al., *Polymer Letters*, vol. 8, pp. 541–547 (1970).

Polymerization Initiated by Triethylborane–Peroxide Mixtures, E. Abuin et al., *Polymer Letters*, vol. 7, pp. 515–518 (1970).

Polymerization of Methyl Methacrylate by Co–orination Compounds of Tri–n–butylborane with Some Electron–donating Compounds, Kojima et al., *Research Report of the Chiba University Faculty of Engineering*, vol. 22, No. 41, pp. 47–55.

Polmerization of Methyl Methacrylate Initiated by Tri–n–butylborane–Organic Halide Systems, M. Yoshikuni, M. Asami, S. Iwabuchi and K. Kojima, *Journal of Polymer Science*, vol. 11, pp. 3115–3124 (1973).

Polymerization of Methyl Methacrylate Initiated by Tribuytlborane–Pyridine System, Kojima et al., *Journal of the Japanese Chemical Society*, No. 11, pp. 2165–2171 (1972).

The Copolymerization of Vinylhydroquinone and Acrylonitrile by Tri–n–butylborane, S. Iwabuchi, M. Ueda, M. Kobayashi and K. Kojima, *Polymer Journal*, vol. 6, No. 2, pp. 185–190 (1974).

Free Radical Polymerization in the Presence of Triethylborane, E. Abuin, J. Cornejo and E. Lissi, *European Polymer Journal*, vol. 11, pp. 779–782 (1975).

Polymerization of Methyl Methacrylate by tri–n–butylborane in the presence of amino acid esters, K. Kojima, S. Iwabuchi, Y. Moriya and M. Yoshikuni, *Polymer*, vol. 16, pp. 601–604 (1975).

Analysis of Mechanism of Radical Formation Resulted from the Initiator System of Triethylboron and Oxygen by Spin Trapping Technique, Sato et al., *Journal of the Japanese Chemical Society*, No. 6, pp. 1080–1084 (1975).

Development of Adhesive Pit and Fissure Sealants Using a MMA Resin Initiated by a Tri–n–butyl Borane Derivative, N. Nakabayashi and E. Masuhara, *Journal of Biomedical Materials Research*, vol. 12, pp. 149–165 (1978).

Vinyl Acetate Polymerization Initiated by Alkylborane–oxidizer–type Systems, S. Ivanchev, L. Shumnyi and V, Konovalenko, *Polymer Science U.S.S.R.* vol. 22, No. 12, pp. 8000–8006 (1980).

Preparation of Hard Tissue Compatible Materials: Dental Polymers, N. Nakabayashi and E. Masuhara, *Biomedical Polymers*, pp. 85–111 (1980).

Mechanism of Initiation of Polymerization of Vinyl Monomers by Means of the Trialkylborane–Acid System, S. Ivanchev and L. Shumnyi, translated from *Doklady Akademii Nauk SSSR*, vol. 270, No. 5, pp. 1127–1129 (1983).

Effect of Organic Bases on Initiating Properties in the System Boronalkylelemental Organic Peroixde During Vinlchloride Polymerization, T. Guzanova, Master Thesis of the Fifth (graduate) year student, Ministry of High and Secondary Special Education Russia, Gorky State University (1983).

Application of Spin Trapping Technique to Radical Polymerization, 20, T. Sato, N. Fukumura and T. Otsu, *Makromol. Chem.* 184, pp. 431–442 (1983).

Importance of Polymerization Initiator Systems and Interfacial Initiation of Polymerization in Adhesive Bonding of Resin to Dentin, Y. Imai, Y. Kadoma, K. Kojima, T. Akimoto, K. Ikakura and T. Ohta, *J. Dent. Res.*, vol. 70, No. 7, pp. 1088–1091 (1991).

Vibrational Analysis by Raman Spectroscopy of the Interface Between Dental Adhesive Resin and Dentin, M. Suzuki, H. Kato and S. Wakumoto, *J. Dent. Res.*, vol. 70, No. 7, pp. 1092–1097 (1991).

Laser–Raman Spectroscopic Study of the Adhesive Interface Between 4–MET/MMA–TBB Resin and Hydroxyapatite or Bovine Enamel, M. Ozaki, M. Suzuki, K. Itoh and S. Wakumoto, *Dental Materials Journal*, vol. 10, No. 2, pp. 105–120 (1991).

Polymerization of Some Vinyl Monomers on Triisobutylboron–Containing Radical Initiators in the Presence of Hydroquinone and Benzoquinone, V. Dodonov and D. Grishin, *High Molecular Compounds*, vol. 35, No. 3, pp. 137–141 (1993).

Synthesis of PP–g–PMMA, PP–g–PVA and PP–g–PCL Copolymers, D. Rhubright and T. Chung, American Chemical Society, Division of Polymer Chemistry, Papers Presented at the Chicago, Illinois Meeting, vol. 34, No. 2, pp. 560–561 (1993).

Functionalized and Grafted Polyolefin Copolymers Prepared by Transition Metal Catalysts and Borane Monomers, T. Chung, *Polymer Reprints*, vol. 35, No. 1, pp. 674–675 (1994).

Photochemical Modification of Fluorocargon Resin Surface to Adhere with Epoxy Resin, M. Okoshi, T. Miyokawa, H. Kashiura and M. Murahara, *Mat. Res. Soc. Symp. Proc. Mat. Res. Soc. Symp. Proc.*, vol. 334, pp. 365–371 (1994).

Chemical Abstract No. 88532r, *Chemical Abstracts*, vol. 73, 1970.

POLYMERIZABLE COMPOSITIONS MADE WITH POLYMERIZATION INITIATOR SYSTEMS BASED ON ORGANOBORANE AMINE COMPLEXES

This is a division of application No. 08/391,642 now U.S. Pat. No. 5,539,070 filed Feb. 21, 1995.

BACKGROUND OF THE INVENTION

1. Field of the Invention

This invention relates generally to organoborane amine complexes and, more particularly, to polymerizable compositions, especially acrylic adhesives, that incorporate polymerization initiator systems based on the organoborane amine complexes. This invention further relates to methods for bonding substrates, particularly low surface energy substrates, using such compositions.

2. Description of the Related Art

An efficient, effective means for adhesively bonding low surface energy substrates such as polyethylene, polypropylene and polytetrafluoroethylene (e.g., TEFLON) has long been sought. The difficulties in adhesively bonding these materials are well known. See, for example, "Adhesion Problems at Polymer Surfaces" by D. M. Brewis that appeared in *Progress in Rubber and Plastic Technology*, volume 1, page 1 (1985). The conventional approaches typically function by: (1) increasing the surface energy of the substrate (to more closely match the surface energies of the substrate and the adhesive thereby promoting better wetting of the substrate by the adhesive) and/or (2) eliminating additives and low molecular weight polymer fractions in the substrate that can migrate to the substrate surface and adversely affect adhesion by forming a weak boundary layer.

As a result, the conventional approaches often use complex and costly substrate surface preparation techniques such as flame treatment, corona discharge, plasma treatment, oxidation by ozone or oxidizing acids, and sputter etching. Alternatively, the substrate surface may be primed by coating it with a high surface energy material. However, to achieve adequate adhesion of the primer, it may be necessary to first use the surface preparation techniques described above. All of these techniques are well known, as reported in *Treatise on Adhesion and Adhesives* (J. D. Minford, editor, Marcel Dekker, 1991, New York, volume 7, pages 333 to 435). The known approaches are frequently customized for use with specific substrates. As a result, they may not be useful for bonding low surface energy substrates generally.

Moreover, the complexity and cost of the presently known approaches do not render them particularly suitable for use by the retail consumer (e.g., home repairs, do-it-yourselfers, etc.) or in low volume operations. One vexing problem is the repair of many inexpensive everyday household articles that are made of polyethylene, polypropylene or polystyrene such as trash baskets, laundry baskets and toys.

Consequently, there has been a considerable and long felt need for a simple, easy to use adhesive that can readily bond a wide variety of substrates, especially low surface energy materials, such as polyethylene, polypropylene and polytetrafluoroethylene, without requiring complicated surface preparation, priming and the like.

This invention is directed to polymerization initiator systems based on organoborane amine complexes and adhesives and other compositions made therewith. The adhesives are especially useful in bonding low surface energy substrates such as polyethylene, polypropylene and polytetrafluoroethylene.

In 1957 G. S. Kolesnikov et al. (Bull. Acad. Sci. USSR, Div. Chem. Sci. 1957, p. 653) reported the use of tributylborane as a catalyst for the polymerization of styrene and methyl methacrylate. The addition of 2 mole % of tributylborane to methyl methacrylate resulted in rapid polymerization; a transparent solid block was formed in 60 to 90 minutes. At about the same time, J. Furakawa et al. (Journal of Polymer Science, volume 26, issue 113, p. 234, 1957) reported that triethylborane had been found to initiate the polymerization of some vinyl compounds such as vinyl acetate, vinyl chloride, vinylidene chloride, methacrylic ester, acrylic ester, and acrylonitrile. J. Furakawa et al. (Journal of Polymer Science, volume 28, issue 116, 1958) later reported that triethyl borane-catalyzed vinyl polymerization could be markedly accelerated with oxygen or oxygen compounds such as hydrogen peroxide and metal oxides. While the presence of oxygen is apparently needed for the polymerization to occur, the organoborane compounds of the type described in these references are known to be quite pyrophoric in air. Hence, the presence of oxygen is simultaneously required and undesirable.

U.S. Pat. No. 3,275,611 "Process for Polymerizing Unsaturated Monomers with a Catalyst Comprising an Organoboron Compound, a Peroxygen Compound and an Amine" issued Sep. 27, 1966 to E. H. Mottus et al. discloses a process for polymerizing olefinic compounds, especially alpha-olefinically unsaturated compounds. Particularly preferred are methacrylate monomers having no more than 20 carbon atoms in the ester group. The organoboron compound and the amine may be added to the reaction mixture separately or they may be added as a preformed complex. The latter approach reportedly has the advantage of making the boron compound more easily handled, especially for certain boron compounds that tend to be pyrophoric in air but which are not pyrophoric when complexed. Especially useful boron catalysts are said to have the following general formulas: $R_3B$, $RB(OR)_2$, $R_2B(OR)$, $R_2BOBR_2$, $R_2BX$, and $R_2BH$, where R is a hydrocarbon radical, preferably an alkyl radical having from 1 to 10 or more carbon atoms (more preferably, up to 6 carbon atoms), and X is a halogen.

Useful amine complexing agents are said to have a basicity that is preferably in the range of about $10^{-6}$ or $10^{-7}$ to $5\times10^{-10}$ or $10^{-10}$. Various amine complexing agents are mentioned although pyridine, aniline, toluidine, dimethylbenzylamine, and nicotine are used in the examples. The amine and boron compounds are used in about a 1:1 molar ratio, assuming one nitrogen function per boron function. Reportedly, any peroxide or hydroperoxide compound may be used as a catalyst component.

While Mottus et al. refer to polymerizing methacrylate monomers, there is no indication that the resulting polymers are useful as adhesives. Various acids are mentioned as monomers that may be polymerized but there is no indication that an acid is a component of the polymerization system.

British Patent Specification No. 1,113,722 "Aerobically Polymerisable Compositions," published May 15, 1968 discloses the polymerization of acrylate monomers through the use of a free-radical catalyst (e.g., peroxides) and triarylborane complexes having the general formula $(R_3)B$-Am wherein R is an aryl radical having from 6 to 12 carbon atoms and Am is, among other things, an amine such as hexamethylenediamine or ethanolamine. The polymerization is activated by heating or the addition of an acid. The resulting compositions are reportedly useful as adhesives.

Chemical Abstracts No. 88532r (volume 73, 1970) "Dental Self-curing Resin" and the full text paper to which it refers report that tributylborane can be made stable in air by complexing it with ammonia or certain amines (e.g., aniline, n-butylamine, piperidine, ethylenediamine) at a mole ratio of one and that the tributylborane can be reactivated with an amine acceptor such as an isocyanate, an acid chloride, a sulfonyl chloride, or anhydrous acetic acid. As a result, the complex can be used to polymerize blends of methyl methacrylate and poly(methylmethacrylate) to provide a dental adhesive. Tributylborane-ethylenediamine complexes and triethylborane-ammonia complexes, each with p-toluenesulfonyl chloride as the amine acceptor, are specifically mentioned.

Chemical Abstracts No. 134385q (volume 80, 1974) "Bonding Polyolefin or Vinyl Polymers" reports that a mixture of 10 parts methyl methacrylate, 0.2 parts tributylborane, and 10 parts poly(methylmethacrylate) was used to bond polyethylene, polypropylene and poly(vinyl acetate) rods.

U.S. Pat. No. 5,106,928 "Acrylic Adhesive Composition and Organoboron Initiator System," issued Apr. 21, 1992 to M. M. Skoultchi et al., discloses a two-part initiator system that is reportedly useful in acrylic adhesive compositions, especially elastomeric acrylic adhesives. The first part of the two-part initiating system is a stabilizing organoborane amine complex; the second part is an organic acid activator. The organoborane compound of the complex has the general formula:

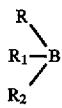

where R, $R_1$ and $R_2$ are either alkyl groups having 1 to 10 carbon atoms or phenyl groups, although alkyl groups of 1 to 4 carbon atoms are preferred. The amine portion of the complex may be ammonia, a primary amine, a secondary amine, or a polyamine containing a primary amine or a secondary amine. Useful amines include n-octylamine, 1,6-diaminohexane, diethylamine, dibutylamine, diethylenetriamine, dipropylenediamine, 1,3-propylenediamine, and 1,2-propylenediamine.

The organic acid activator is a compound that will destabilize or liberate the free organoborane compound by removing the amine group, thereby allowing it to initiate the polymerization process. Preferably, the organic acid has the formula R-COOH where R is hydrogen, an alkyl or alkenyl group having 1 to 8 (preferably 1 to 4) carbon atoms, or an aryl group with 6 to 10 (preferably 6 to 8) carbon atoms.

Twelve organoborane amine initiator complexes are described in conjunction with Example I. In those complexes based on diamines or triamines, the nitrogen atom to boron atom ratio ranges from 2:1 to 4:1. In those complexes based on diethylamine and n-octylamine, the nitrogen atom to boron atom ratio is 1.5:1

The adhesive compositions are reportedly particularly useful in structural and semi-structural applications such as speaker magnets, metal-metal bonding, (automotive) glass-metal bonding, glass-glass bonding, circuit board component bonding, selected plastic to metal, glass, wood, etc. and electric motor magnets. Those plastics that may be bonded are not further described.

SUMMARY OF THE INVENTION

The invention relates to polymerizable acrylic compositions, especially acrylic adhesives, that incorporate polymerization initiator systems based on organoborane amine complexs. The adhesives are particularly useful in bonding low surface energy substrates (e.g., polyethylene, polypropylene, polytetrafluoroethylene, etc.) that, heretofore, have been bonded using complex and costly surface preparation techniques.

The polymerizable acrylic compositions comprise and, more preferably, consist essentially of at least one acrylic monomer (preferably alkyl acrylates such as butylacrylate and/or alkyl methacrylates such as methylmethacrylate), an effective amount of an organoborane amine complex, and an effective amount of an organic or inorganic acid (e.g., acrylic acid, methacrylic acid or $SnCl_4$) for initiating polymerization of the acrylic monomer.

Useful organoborane amine complexes have the following general formula:

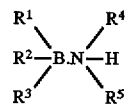

wherein:

$R^1$ is an alkyl group having 1 to 10 (preferably 2 to 5) carbon atoms;

$R^2$ and $R^3$ are independently selected from phenyl-containing groups and alkyl groups having 1 to 10 carbon atoms, alkyl groups having 2 to 5 carbon atoms being preferred;

$R^4$ is selected from the group consisting of $CH_2CH_2OH$ and $(CH_2)_xNH_2$ wherein x is an integer greater than 2, preferably from 2 to 6, and most preferably 6;

$R^5$ is hydrogen (preferred) or an alkyl group having 1 to 10 carbon atoms; and the nitrogen atom to boron atom ratio is about 1:1 to 2:1, more preferably about 1:1 to 1.5:1, and most preferably about 1:1.

The organoborane amine complex is typically provided in an amount of about 0.15 to 3 mole % based on the number of moles of acrylic groups, moieties or functionality (more preferably about 0.2 to 2.5 mole %; most preferably about 1 to 1.5 mole %). An effective amount of the acid is about 30 to 540 mole % (most preferably about 230 mole %), based on the number of equivalents of amine groups, moieties or functionality.

Among the useful additives that may be optionally included within these compositions are thickening agents (such as polymethylmethacrylate) and a small amount (about 0.1 to 7 mole % based on the number of moles of acrylic functionality) of a substantially uncomplexed organoborane, the latter being especially useful if the organoborane amine complex is based on monoethanolamine.

In another aspect the invention relates to a method for bonding low surface energy polymeric substrates using the polymerizable acrylic compositions described above. The substrate surface may first be primed with a composition comprising the organoborane amine complex in an inert organic solvent (e.g., to about 5 to 15 wt. %), in which case the inclusion of the organoborane amine complex in the polymerizable composition is optional.

In yet another aspect of the invention, certain compositions are useful as primers for increasing the adhesion of a subsequently applied adhesive to fluoroplastic substrates. Among such useful primers are those based on acrylic monomers, organoboranes and an oxygen source (e.g. peroxides or atmospheric oxygen) as well as those based on acrylic monomers, organoborane amine complexes, and acids.

DETAILED DESCRIPTION OF THE PREFERRED EMBODIMENTS

In a broad aspect, this invention relates to polymerizable acrylic compositions, especially acrylic adhesives, that are produced using polymerization initiator systems based on organoborane amine complexes. The adhesives are particularly useful in bonding low surface energy substrates (e.g., polyethylene, polypropylene, polytetrafluoroethylene, etc.) that, heretofore, have been bonded using complex and costly surface preparation techniques.

The polymerization initiator systems useful in the invention comprise and, more preferably, consist essentially of an effective amount of an organoborane amine complex and an effective amount of an acid for liberating the organoborane to initiate polymerization. Organoborane amine complexes useful in the invention have the following general structure:

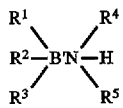

where $R^1$ is an alkyl group having 1 to 10 carbon atoms and $R^2$ and $R^3$ are independently selected from alkyl groups having 1 to 10 carbon atoms and phenyl-containing groups. More preferably, $R^1$, $R^2$ and $R^3$ are alkyl groups having 1 to 5 carbon atoms such as methyl, ethyl, propyl, iso-propyl, n-butyl, iso-butyl, and pentyl. In general, shorter carbon chain lengths are preferred for the $R^1$, $R^2$ and $R^3$ groups as this promotes enhanced stability of the complex in air. Smaller, less bulky substituents are also preferred as larger, more bulky groups may negatively affect adhesion. By "independently selected" it is meant that $R^2$ and $R^3$ may be the same or that they may be different. $R^1$ may be the same as $R^2$ or $R^3$, or it may be different. Preferably $R^1$, $R^2$ and $R^3$ are the same. The tripropyl, tri-iso-propyl, and tri-n-butyl alkylboranes have been found to be especially useful.

The amine component of the complex may be either monoethanolamine, a primary alkyl diamine, or a secondary alkyl diamine. Consequently, $R^4$ may be selected from the group consisting of $CH_2CH_2OH$ and $(CH_2)_xNH_2$, wherein x is an integer greater than 2. $R^5$ is either hydrogen or an alkyl group having 1 to 10 carbon atoms. In more preferred complexes, $R^5$ is hydrogen (so as to reduce the steric hinderance within the organoborane amine complex which could inhibit the formation of the complex itself) and $R^4$ is either $CH_2CH_2OH$ or $(CH_2)_xNH_2$ where x is an integer from 2 to 6. Most preferred, however, are complexes where the $R^4$ is $CH_2CH_2OH$ (monoethanolamine) or $(CH_2)_6N_2$ (1,6-hexamethylenediamine).

Importantly, and as shown more fully hereinbelow, the nitrogen atom to boron atom ratio in the complex is about 1:1 to 2:1, more preferably about 1:1 to less than 2:1, even more preferably about 1:1 to 1.5:1, and most preferably about 1:1. At nitrogen atom to boron atom ratios in excess of 2:1 the practical utility of the complex in a polymerization initiator system is diminished as the amount of complex that must be employed to achieve a useful molecular weight during polymerization becomes too large. On the other hand, a nitrogen atom to boron atom ratio of less than 1:1 leaves free organoborane, a material that tends to be pyrophoric.

An effective amount of the organoborane amine complex is an amount that is large enough to permit polymerization to readily occur to obtain an acrylic polymer of high enough molecular weight for the desired end use. If the amount of organoborane amine complex is too high, then the polymerization may proceed too rapidly to allow for effective mixing and application of the composition. The useful rate of polymerization will depend in part on the method of applying the composition to the substrate. Thus, the rate of polymerization for a high speed automated industrial applicator can be faster than if the composition is applied with a hand applicator or if the composition is mixed manually.

Within these parameters, an effective amount of the organoborane amine complex is about 0.15 to 3 mole %, based on the number of moles of acrylic functionality, more preferably about 0.2 to 2.5 mole %, and most preferably about 1 to 1.5 mole %. If the amine is provided by monoethanolamine, it has been found that an effective amount of the complex is greater than 2 mole % but less than about 5 mole %. By "acrylic functionality" is meant acrylic and substituted acrylic moieties or chemical groups; that is, groups which have the general structure

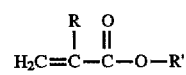

wherein R and R' are organic radicals that may be the same or that may be different.

As explained below, however, it is sometimes advantageous to further include a small amount of additional, substantially uncomplexed organoborane. In these instances, an effective amount of the complex is about 0.3 to 5 mole %, based on the number of moles of acrylic functionality, more preferably about 0.5 to 4 mole %, and most preferably about 1 to 3 mole %.

Advantageously, the organoborane amine complexes useful in the invention are air stable. By "air stable" it is meant that when the complexes are stored in a capped vessel at room temperature (about 20° to 22° C.) and under otherwise ambient conditions (i.e., not under a vacuum and not in an inert atmosphere), the complexes remain useful as polymerization initiators for at least about two weeks, although the complexes may be readily stored under these conditions for many months and up to a year or more. By "air stable" it is also meant that the complexes are not pyrophoric, as explained more fully hereinbelow. The air stability of the complex is enhanced if it is provided as a crystalline material. In its most stable form, the complex exists as clear white, solid, needlelike crystals. However, the complex is still useful even if it is provided as an amorphous solid or a viscous, syrup-like liquid. Over time, the most preferred clear white, solid, needlelike crystals may assume these forms.

The organoborane amine complex may be readily prepared using known techniques. Typically, the amine, if provided as a solid, is ground to a fine powder (preferably in an inert atmosphere) and combined with the organoborane (also in an inert atmosphere) with slow stirring. An exotherm is often observed and cooling of the mixture is, therefore, recommended. Due to the high vapor pressure of some of the materials that may be used, it is desirable to keep the reaction temperature below about 70° to 80° C., but the temperature should not be kept so low that the reaction product prematurely crystallizes. Once the materials have been well mixed, the complex is permitted to cool so that crystals thereof may form. No special storage conditions are required although it is preferred that the complex be kept in a capped vessel in a cool, dark location. Advantageously, the complexes used in the invention are prepared in the absence of organic solvents that would later have to be removed.

Turning now to the acid, this component liberates the organoborane by removing the amine group thereby permitting the organoborane to initiate polymerization. Any acid that can liberate the organoborane by removing the amine group may be employed. Useful acids include Lewis acids (e.g., $SnCl_4$, $TiCl_4$ and the like) and Bronsted acids such as those having the general formula $R^6$-COOH, where $R^6$ is hydrogen, an alkyl group, or an alkenyl group of 1 to 8 and preferably 1 to 4 carbon atoms, or an aryl group of 6 to 10, preferably 6 to 8 carbon atoms. The alkyl and alkenyl groups may comprise a straight chain or they may be branched. Such groups may be saturated or unsaturated. The aryl groups may contain substituents such as alkyl, alkoxy or halogen moieties. Illustrative acids of this type include acrylic acid, methacrylic acid, acetic acid, benzoic acid, and p-methoxybenzoic acid. Other useful Bronsted acids include HCl, $H_2SO_4$, $H_3PO_4$ and the like. $SnCl_4$, acrylic acid and methacrylic acid are preferred.

The acid should be used in an amount effective to promote polymerization. If too little acid is employed, the rate of polymerization may be too slow and the monomers that are being polymerized may not adequately increase in molecular weight. However, a reduced amount of acid may be helpful in slowing the rate of polymerization. On the other hand, if too much acid is used, then the polymerization tends to proceed too quickly and, in the case of adhesives, the resulting materials may demonstrate inadequate adhesion to low energy surfaces. On the other hand, an excess of acid may promote adhesion to higher energy surfaces. Within these parameters, the acid should, preferably, be provided in an amount of about 30 to 540 mole % based on the number of equivalents of amine functionality in the complex, more preferably about 100 to 350 mole %, and most preferably about 150 to 250 mole %. In the case of methacrylic acid and an organoborane amine complex based on tripropylborane and 1,6-hexamethylenediamine, about 0.5 to 7 wt. %, more preferably about 3 wt. % based on the total weight of the composition, has been found to be useful.

The organoborane amine complex initiator systems are especially useful in polymerizing acrylic monomers, particularly for making polymerizable acrylic adhesives. By "acrylic monomer" is meant polymerizable monomers having one or more acrylic or substituted acrylic moieties, chemical groups or functionality; that is, groups having the general structure

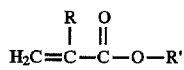

wherein R and R' are organic radicals that may be the same or that may be different. Blends of acrylic monomers may also be used. The polymerizable acrylic monomer may be monofunctional, polyfunctional or a combination thereof.

The most useful monomers are monofunctional acrylate and methacrylate esters and the substituted derivatives thereof such as hydroxy, amide, cyano, chloro, and silane derivatives. Such monomers include, methyl acrylate, methyl methacrylate, ethyl acrylate, ethyl methacrylate, isobornyl methacrylate, hydroxyethyl methacrylate, hydroxypropyl acrylate, hydroxypropyl methacrylate, butyl acrylate, n-octyl acrylate, 2-ethylhexyl acrylate, 2-ethylhexyl methacrylate, decylmethacrylate, dodecyl methacrylate, cyclohexyl methacrylate, tert-butyl methacrylate, acrylamide, N-methyl acrylamide, diacetone acrylamide, N-tert-butyl acrylamide, N-tert-octyl acrylamide, N-butoxyacrylamide, gamma-methacryloxypropyl trimethoxysilane, 2-cyanoethyl acrylate, 3-cyanopropyl acrylate, tetrahydrofurfuryl methacrylate, tetrahydrofurfuryl chloroacrylate, glycidyl acrylate, glycidyl methacrylate, and the like. Dimethylaminoethyl acrylate and dimethylamino methacrylate may be used.

Particularly preferred are blends of alkyl acrylates (e.g., butyl acrylate) and alkyl methacrylates (e.g.,methyl methacrylate). Such polymerizable compositions according to the invention may broadly comprise, based on the total weight of the composition, about 10 to 60 wt. % (more preferably about 30 to 40 wt. %) of the alkyl methacrylate, and about 10 to 50 wt. % (more preferably about 25 to 35 wt. %) of the alkyl acrylate.

Another useful class of polymerizable monomers corresponds to the general formula:

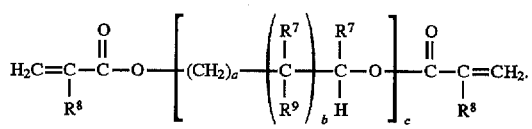

$R^7$ may be selected from the group consisting of hydrogen methyl, ethyl, —$CH_2OH$, and

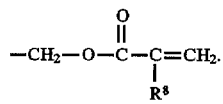

$R^8$ may be selected from the group consisting of chlorine, methyl and ethyl. $R^9$ may be selected from the group consisting of hydrogen, hydroxy, and

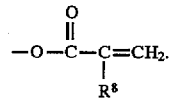

The value of a is an integer greater than or equal to 1, more preferably, from 1 to about 8, and most preferably from 1 to 4. The integral value of b is greater than or equal to 1, more preferably, from 1 to about 20. The value of c is 0 or 1.

Acrylic monomers useful with the polymerization initiator systems include ethylene glycol dimethacrylate, ethylene glycol diacrylate, polyethylene glycol diacrylate, tetraethylene glycol dimethacrylate, diglycerol diacrylate, diethylene glycol dimethacrylate, pentaerythritol triacrylate, trimethylolpropane trimethacrylate, and other polyether diacrylates and dimethacrylates.

Other polymerizable monomers useful in the invention have the general formula:

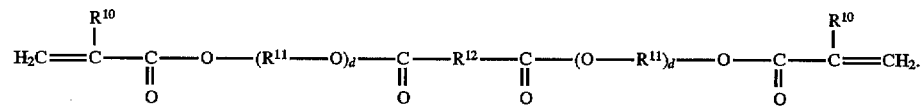

$R^{10}$ may be hydrogen, chlorine, methyl or ethyl; $R^{11}$ may be an alkylene group with 2 to 6 carbon atoms; and $R^{12}$ is $(CH_2)_e$ in which e is an integer of 0 to 8, or one of the following:

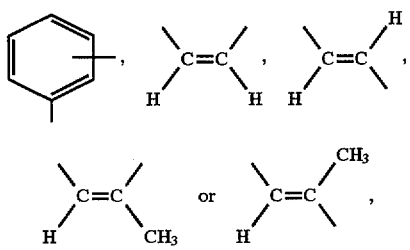

the phenyl group being substitutable at any one of the ortho, meta or para positions. The value of d is an integer of 1 to 4.

Typical monomers of this class include dimethacrylate of bis(ethylene glycol) adipate, dimethacrylate of bis(ethylene glycol) maleate, dimethacrylate of bis(ethylene glycol) phthalate, dimethacrylate of bis(tetraethylene glycol) phthalate, dimethacrylate of bis(tetraethylene glycol) sebacate, dimethacrylates of bis(tetraethylene glycol) maleate, and the diacrylates and chloroacrylates corresponding to the dimethacrylates, and the like.

Also useful are monomers that are isocyanate-hydroxyacrylate or isocyanate-aminoacrylate reaction products. These may be characterized as acrylate terminated polyurethanes and polyureides or polyureas. Such monomers have the following general formula:

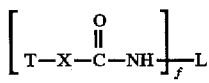

where X is selected from the group consisting of —O— and

$R^{13}$ is selected from the group consisting of hydrogen and lower alkyl groups (i.e., 1 to 7 carbon atoms). T is the organic residue of an active hydrogen-containing acrylic ester the active hydrogen having been removed and the ester being hydroxy or amino substituted on the alkyl portion thereof (including the methyl, ethyl and chlorine homologs). The integral value of f is from 1 to 6. L is a mono- or polyvalent organic radical selected from the group consisting of alkyl, alkylene, alkenyl, cycloalkyl, cycloalkylene, aryl, aralkyl, alkaryl, poly(oxyalkylene), poly (carboalkoxyalkylene), and heterocyclic radicals, both substituted and unsubstituted.

Typical monomers of this class include the reaction product of mono- or polyisocyanates, for example, toluene diisocyanate, with an acrylate ester containing a hydroxy or an amino group in the non-acrylate portion thereof, for example, hydroxyethyl methacrylate.

Still another class of monomers useful in the present application are the mono- and polyacrylate and methacrylate esters of bisphenol type compounds. These monomers may be described by the following formula:

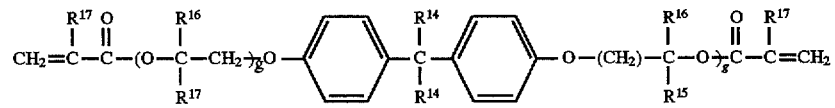

where $R^{14}$ is methyl, ethyl, carboxyalkyl or hydrogen; $R^{15}$ is hydrogen, methyl or ethyl; $R^{16}$ is hydrogen, methyl or hydroxyl; $R^{17}$ is hydrogen, chlorine, methyl or ethyl; and g is an integer having a value of 0 to 8.

Representative monomers of the above-described class include dimethacrylate and diacrylate esters of 4,4'-bis-hydroxyethoxy-bisphenol A, dimethacrylate and diacrylate esters of bisphenol A, etc.

The compositions may further comprise a variety of optional additives. One particularly useful additive is a thickener such as a low (i.e., less than or equal to about 100,000) molecular weight polymethyl methacrylate which may be incorporated in an amount of about 20 to 40 wt. % (weight percent), based on the weight of the composition. Thickeners may be employed to increase the viscosity of the composition to a more easily applied viscous syrup-like consistency.

Another useful adjuvant is a crosslinking agent that can be used to enhance the solvent resistance of the adhesive bond. Typically employed in an amount of about 0.2 to 1 weight percent based on the weight of the composition, useful crosslinkers include ethylene glycol dimethacrylate, ethylene glycol diacrylate, triethyleneglycol dimethacrylate, diethylene glycol bismethacryloxy carbonate, polyethylene glycol diacrylate, tetraethylene glycol dimethacrylate, diglycerol diacrylate, diethlene glycol dimethacrylate, pentaerythritol triacrylate, trimethylopropane trimethacrylate, and other polyether diacrylates and dimethacrylates.

Peroxides may be optionally included to adjust the speed at which the compositions polymerize or to complete the polymerization.

Small amounts of inhibitors such as hydroquinone may be used to prevent or reduce degradation of the acrylic monomers during storage. Inhibitors may be added in an amount that does not materially reduce the rate of polymerization or the adhesive properties of an adhesive made therewith, typically about 0.1 to 5% based on the weight of the polymerizable monomers.

Various plasticizers and elastomeric fillers (i.e., rubbery polymers based on polyisoprene, polybutadiene, polyolefins, polyurethanes and polyesters) may be added to improve flexibility or toughness. Other possible additives include non-reactive colorants, fillers (e.g., carbon black), etc. The optional additives are employed in an amount that does not significantly adversely affect the polymerization process or the desired properties of compositions made therewith.

As will be shown below, the polymerizable acrylic compositions of the invention are especially useful for adhesively bonding low surface energy substrates that historically have been very difficult to bond without using complicated surface preparation techniques, priming, etc. By low surface energy substrates is meant materials that have a surface energy of less than 45 mJ/m$^2$, more typically less than 40 mJ/m$^2$ or less than 35 mJ/m$^2$. Included among such materials are polyethylene, polypropylene, acrylonitrile-butadiene-styrene, polyamide, and fluorinated polymers such as polytetrafluoroethylene (TEFLON) which has a surface energy of less than 20 mJ/m$^2$. Other polymers of somewhat higher surface energy that may be usefully bonded with the compositions of the invention include polycarbonate and polymethylmethacrylate. However, the invention is not so limited; the compositions may be used to bond any thermoplastic as well as wood, ceramics, concrete and primed metals.

The polymerizable compositions of the invention are easily used as two-part adhesives. The components of the polymerizable composition are blended as would normally be done when working with such materials. The acid component of the polymerization initiator system is usually included in this blend so as to separate it from the organoborane amine complex, thus providing one part of the two-part composition. The organoborane amine complex of the polymerization initiator system provides the second part of the composition and is added to the first part shortly before it is desired to use the composition. The complex may be added to the first part directly or it may be predissolved in an appropriate carrier such as a small amount of methyl methacrylate. Once the two parts have been combined, the composition should be used quickly, as the useful pot life may be on the order of about a quarter-hour or so depending upon the monomer mix, the amount of complex, and the temperature at which the bonding is to be performed.

The polymerizable composition is applied to one or both substrates and then the substrates are joined together with pressure to force excess composition out of the bond line. This also has the advantage of displacing composition that has been exposed to air and that may have begun to oxidize. In general, the bonds should be made shortly after the composition has been applied, preferably within about 10 minutes. The typical bond line thickness is about 0.1 to 0.3 mm. The bonding process can easily be carried out at room temperature and to improve the degree of polymerization it is desirable to keep the temperature below about 40° C., preferably below 30° C., and most preferably below about 25° C.

The bonds will cure to a reasonable green strength to permit handling of the bonded components within about 2 to 3 hours. Full strength will be reached in about 24 hours under ambient conditions; post-curing with heat may be used if desired.

When bonding fluoroplastics, it is advantageous to cool the first part of the two-part composition to about 0° to 5° C. before adding the organoborane amine complex. The bond should be made as soon after the composition has been applied as practical; performing the bonding operation at less than room temperature is also helpful.

The polymerization initiator systems are also very useful in forming primers. A primer solution may be prepared by dissolving the organoborane amine complex in an inert organic solvent such as pentane, hexane, petroleum ether, white spirits, benzene, toluene, ethylacetate, butylacetate, and the like. While any of the above described organoborane amine complexes may be used in making primers, those which demonstrate additional stability in organic solvents, such as those complexes based on tripropylborane, are preferred.

An effective amount of the complex is a concentration of about 5 to 15 wt. % in the solvent, preferably about 10 wt. %. A 10 wt. % primer solution applied at about 80 to 100 g/m$^2$ is adequate. If the concentration is too low, then there is insufficient primer to effectively polymerize the subsequently applied acrylic composition. If the concentration is too high, then the polymerization may proceed too quickly. In either event, the resulting adhesive bond may demonstrate reduced shear adhesion.

The primer should be applied to the surfaces of both substrates that are to be bonded, although the subsequently applied acrylic composition need only be provided on one surface. Once the solvent has been evaporated, the composition is desirably applied as soon after the primer has been deposited as practically possible so as to avoid oxidative degradation of the primer. However, the use of the primer offers the distinct advantage of permitting the application of the acrylic composition to be delayed for several hours, as much as about 7 hours or even more. Otherwise, the bonding process is as described above with the use of the two-part compositions.

In addition to their outstanding utility as adhesives, the polymerizable acrylic compositions of the invention may be used as sealants, coatings, and injection molding resins. They may also be used as matrix resins in conjunction with glass and metal fiber mats such as in resin transfer molding operations. They may further be used as encapsulants and potting compounds such as in the manufacture of electrical components, printed circuit boards and the like.

The invention will be more fully appreciated with reference to the following nonlimiting examples in which all weights are given as weight percents (wt. %) based on the total weight of the composition which is 100 wt. %. Data reported in the following examples have been rounded off to one significant digit following the decimal. Accordingly, not all compositions may sum to exactly 100.0%.

EXAMPLES 1 TO 13

Examples 1 to 13 illustrate the pyrophoricity of various organoboranes and organoborane amine complexes. The organoborane amine complexes were prepared by combining the organoborane and the amine in an inert argon atmosphere with cooling to form the complex. The pyrophoricity of the various organoboranes and organoborane amine complexes was assessed in a "Charring Time" test and in an "Ignition Time" test.

The charring time was determined by applying one drop of the organoborane or the organoborane amine complex to a 30 mm×30 mm piece of cotton fabric and measuring the time that elapsed until the fabric began to char or ignite (whichever first occurred). The ignition time was determined by dipping another 30 mm×30 mm piece of cotton fabric into the organoborane or the organoborane amine complex in an inert atmosphere, exposing the fabric to air, and measuring the time that elapsed until the fabric ignited. The tests were terminated after about 24 hours if no charring or ignition had occurred. The test results are reported below in Table 1.

Terms used in these examples are defined according to the following schedule:

| Term | Definition |
| --- | --- |
| Bu | Butyl |
| i-Bu | iso-Butyl |
| Et | Ethyl |
| Pr | Propyl |

TABLE 1

| Example No. | Organoborane or Organoborane Amine Complex | Charring Time (seconds) | Ignition Time (seconds) |
| --- | --- | --- | --- |
| 1 | Pr$_3$B | 1* | 1 |
| 2 | i-Bu$_3$B | 1 | 1 |

TABLE 1-continued

| Example No. | Organoborane or Organoborane Amine Complex | Charring Time (seconds) | Ignition Time (seconds) |
|---|---|---|---|
| 3 | Bu$_3$B | 1 | 1 |
| 4 | Pr$_3$B.NH$_3$ | 4-6 | 10 |
| 5 | Pr$_3$B.HNEt$_2$ | 3* | 1 |
| 6 | Pr$_3$B.H$_2$NBu-i | 55 | 104 |
| 7 | i-Bu$_3$B.NH$_3$ | 4 | 4 |
| 8 | i-Bu$_3$B.HNEt$_2$ | 2 | 1 |
| 9 | i-Bu$_3$B.H$_2$NBu-i | 12 | 20 |
| 10 | 2Pr$_3$B.H$_2$N(CH$_2$)$_6$NH$_2$ | Did not char or ignite | Did not ignite |
| 11 | 2i-Bu$_3$B.H$_2$N(CH$_2$)$_6$NH$_2$ | Did not char or ignite | Did not ignite |
| 12 | Pr$_3$B.H$_2$N(CH$_2$)$_6$NH$_2$ | Did not char or ignite | Did not ignite |
| 13 | i-Bu$_3$B.H$_2$N(CH$_2$)$_6$NH$_2$ | Did not char or ignite | Did not ignite |

*Ignited.

Table 1 shows that uncomplexed organoboranes (examples 1 to 3) are inherently extremely pyrophoric and that complexing these materials with ammonia, diethylamine, or isobutyl amine (examples 4 to 9) does not sufficiently reduce their inherent pyrophoricity to render the resulting complex readily usable. However, in examples 10 to 13 where the organoboranes were complexed with 1,6-hexamethylenediamine, the cotton fabric neither charred nor ignited. The organoborane amine complexes of examples 10 to 13 are not pyrophoric and remain stable for at least about 2 weeks when stored in a sealed vessel at room temperature under otherwise ambient conditions. Thus, the organoborane amine complexes of examples 10 to 13 are "air stable" and are useful in providing polymerization initiator systems and compositions made therewith according to the invention.

EXAMPLES 14 TO 53

Examples 14 to 53 show the excellent adhesion to low surface energy substrates such as polytetrafluoroethylene (PTFE) and polyethylene (PE) that is possible when polymerizable acrylic adhesive compositions that incorporate polymerization initiator systems are used.

Except as noted below, in each example a methacrylate monomer, an acrylate monomer, and a thickening agent ("Thickener") were stirred together until complete dissolution occurred using heat as necessary to promote dissolution. An acid, an organoborane amine complex, and an additional amount of substantially uncomplexed organoborane were then added and mixed. Within about 10 minutes of the compositions having been prepared they were applied to polytetrafluoroethylene and polyethylene substrates and tested for overlap shear strength at room temperature following the procedures of State Standard of the (Former) Soviet Union (GOST) 14759-69 ("Adhesive joints of metals. Method for determining the shear strength.").

More specifically, and unless noted otherwise, the composition was applied to substrate coupons measuring 60 mm×20 mm×2 mm thick. The coupons were mated to provide a 200 mm$^2$ overlap area and an adhesive bond that was about 0.1 to 0.3 mm thick. The bonded samples were usually cured for about 24 hours before being mounted in a tensile testing apparatus and evaluated at a crosshead speed of 20 mm/min. The reported data are an average of five samples. The test results in megaPascals (MPa) are reported below in Table 2.

For polyethylene bonding, overlap shear strength values below about 5 MPa are not generally considered desirable, values in the range of about 5 to 8 MPa are marginally acceptable, and values greater than about 8 are considered excellent. For polytetrafluoroethylene bonding, overlap shear strength values below about 3 MPa are generally considered undesirable, values in the range of about 3 to 5 MPa are regarded as marginally acceptable, and values in excess of 5 MPa are considered excellent.

Also reported in Table 2 is the failure mode for the various bonded composites. "A" refers to adhesional failure (i.e., failure at the interface between the substrate and the adhesive), "S" refers to substrate failure (i.e., fracture or elongation of at least one of the substrates), and "M" refers to mixed failure (i.e., a combination of substrate failure and failure within the adhesive bond). The most preferred failure modes are substrate failure and mixed failure.

Except as noted below, in each example the methacrylate monomer was methylmethacrylate, the acrylate monomer was n-butylacrylate, the organoborane amine complex was tripropylborane complexed with monoethanolamine at a nitrogen atom to boron atom ratio of 1:1, the additional organoborane was tripropylborane, and the thickener was polymethylmethacrylate.

TABLE 2

| Example No. | Wt. % Methacrylate Monomer | Wt. % Acrylate Monomer | Wt. % Complex | Wt. % Organo-borane | Acid Formula | Acid Wt. % | Wt. % Thickener | Shear Strength (MPa) PTFE | Shear Strength (MPa) PE | Failure Mode PTFE | Failure Mode PE |
|---|---|---|---|---|---|---|---|---|---|---|---|
| 14 | 61.5 | 26.0 | 0.5 | 1.5 | SnCl$_4$ | 0.5 | 10.0 | 0.6 | 1.5 | A | S |
| 15 | 54.5 | 23.0 | 0.5 | 1.5 | SnCl$_4$ | 0.5 | 20.0 | 5.2 | 10.2 | A | S |
| 16 | 49.1 | 21.4 | 0.5 | 1.5 | SnCl$_4$ | 0.5 | 27.0 | 5.2 | 12.0 | A | S |
| 17 | 42.1 | 18.4 | 0.5 | 1.5 | SnCl$_4$ | 0.5 | 37.0 | 5.3 | 12.0 | A | S |
| 18 | 49.1 | 21.4 | 0.5 | 1.5 | SnCl$_4$ | 0.5 | 27.0 | 5.2 | 11.7 | A | S |
| 19 | 49.1 | 21.4 | 0.5 | 1.5 | SnCl$_4$ | 0.5 | 27.0[1] | 5.2 | 11.7 | A | S |
| 20 | 49.1 | 21.4 | 0.5 | 1.5 | SnCl$_4$ | 0.5 | 27.0[2] | 5.3 | 11.2 | A | S |
| 21 | 54.5 | 23.0 | 0.5 | 1.5 | SnCl$_4$ | 0.5 | 20.0[3] | 5.3 | 11.9 | A | S |
| 22 | 54.5 | 23.0 | 0.5 | 1.5 | SnCl$_4$ | 0.5 | 20.0[2] | 4.9 | 10.2 | A | S |
| 23 | 54.5 | 23.0[4] | 0.5 | 1.5 | SnCl$_4$ | 0.5 | 20.0 | 5.2 | 12.2 | A | S |
| 24 | 54.5 | 23.0[5] | 0.5 | 1.5 | SnCl$_4$ | 0.5 | 20.0 | 5.2 | 10.4 | A | S |
| 25 | 54.5[6] | 23.0 | 0.5 | 1.5 | SnCl$_4$ | 0.5 | 20.0 | 5.0 | 9.9 | A | S |
| 26 | 37.2 | 24.8 | 5.0 | 1.0 | HCl[8] | 5.0 | 27.0 | 5.1 | 11.2 | A | S |
| 27 | 39.9 | 26.6 | 3.0 | 0.5 | HCl[8] | 3.0 | 27.0 | 1.5 | 11.4 | A | S |
| 28 | 37.7 | 25.2 | 5.0 | 0.1 | SnCl$_4$ | 5.0 | 27.0 | 3.2 | 12.0 | A | S |
| 29 | 40.1 | 26.8 | 3.0 | 1.0 | SnCl$_4$ | 3.0 | 27.0 | 5.0 | 11.5 | A | S |

TABLE 2-continued

| Example No. | Wt. % Methacrylate Monomer | Wt. % Acrylate Monomer | Wt. % Complex | Wt. % Organo-borane | Acid Formula | Wt. % | Wt. % Thickener | Shear Strength (MPa) PTFE | PE | Failure Mode PTFE | PE |
|---|---|---|---|---|---|---|---|---|---|---|---|
| 30 | 47.7 | 18.5 | 0.5 | 3.0 | SnCl₄ | 0.5 | 30.0 | 5.3 | 12.4 | A | S |
| 31 | 37.7 | 25.2 | 5.0 | 0.1 | TiCl₄ | 5.0 | 27.0 | 3.0 | 11.9 | A | S |
| 32 | 37.2 | 24.8 | 5.0 | 1.0 | H₂SO₄ | 5.0 | 27.0 | 4.2 | 10.8 | A | S |
| 33 | 38.1 | 25.9 | 5.0 | 1.0 | H₃PO₄ | 3.0 | 27.0 | 4.0 | 10.5 | A | S |
| 34 | 39.8 | 26.2 | 3.0 | 1.0 | H₃PO₄ | 3.0 | 27.0 | 4.5 | 11.3 | A | S |
| 35 | 13.9 | 63.6 | 0.5 | 1.5 | H₃PO₄ | 0.5 | 20.0 | 5.3 | 12.2 | A | S |
| 36 | 47.5 | 20.0 | 0.5 | 1.5 | H₃PO₄ | 0.5 | 30.0 | 5.3 | 11.5 | A | S |
| 37 | 38.0 | 38.5 | 1.0 | 1.5 | SnCl₄ | 1.0 | 20.0 | 4.8 | 12.1 | A | S |
| 38 | 69.0 | 5.0 | 0.5 | 5.0 | SnCl₄ | 0.5 | 20.0 | 3.6 | 9.1 | A | S |
| 39 | 72.5 | 5.0 | 0.5 | 1.5[8] | SnCl₄ | 0.5 | 20.0 | 5.1 | 11.9 | A | S |
| 40 | 44.1 | 29.4 | 3.0 | 0.5 | CH₃COOH | 3.0 | 20.0 | 4.2 | 11.2 | A | S |
| 41 | 44.1 | 29.4 | 3.0 | 0.5 | CH₂=CCOOH | 3.0 | 20.0 | 3.6 | 10.8 | A | S |
| 42 | 44.1 | 29.4 | 3.0 | 0.5 | CH₂=C(CH₃)—COOH | 3.0 | 20.0 | 3.2 | 10.5 | A | S |
| 43 | 49.6 | 21.4 | 0.0 | 2.0 | SnCl₄ | 2.0 | 25.0 | 0.5 | 1.1 | A | A |
| 44 | 51.0 | 20.4 | 0.0 | 1.2 | SnCl₄ | 0.4 | 27.0 | 0.8 | 1.3 | A | A |
| 45 | 50.7 | 20.3 | 0.0 | 1.6 | SnCl₄ | 2.4 | 25.0 | 0.8 | 1.2 | A | A |
| 46 | 52.1 | 20.9 | 0.0 | 1.6 | SnCl₄ | 0.4 | 25.0 | 0.7 | 1.1 | A | A |
| 47 | 47.2 | 17.8 | 0.0 | 7.0 | SnCl₄ | 3.0 | 25.0 | 0.1 | 0.4 | A | A |
| 48 | 47.6 | 16.4 | 0.0 | 4.0 | SnCl₄ | 7.0 | 25.0 | 0.1 | 0.2 | A | A |
| 49 | 49.6 | 21.4 | 2.0 | 0.0 | SnCl₄ | 2.0 | 25.0 | 0.5 | 1.1 | A | A |
| 50 | 68.1 | 30.0 | 0.0 | 1.4[8] | NA | 0.0 | 0.0 | 0.0 | 0.0 | NA | NA |
| 51 | 49.0 | 0.0 | 0.0 | 2.0[8] | NA | 0.0 | 49.0 | 0.0 | 0.0 | NA | NA |
| 52 | 50.0 | 21.2 | 0.4 | 0.05 | SnCl₄ | 0.4 | 27.0 | 0.3 | 0.9 | A | A |
| 53 | 61.0 | 31.5 | 0.5 | 1.5 | SnCl₄ | 0.5 | 5.0 | 0.1 | 0.3 | A | A |

NA = Not applicable
[1]Quartz powder
[2]Polystyrene-butylene
[3]Fumed silica
[4]Methylacrylate
[5]1,1,5 Trihydrooctafluoroamylacrylate
[6]Butylmethacrylate
[7]1.1 Molar
[8]Tributylborane Examples 14 to 17 show the effect of varying the relative amounts of the methacrylate monomer, the acrylate monomer, and the thickening agent. In example 14, insufficient thickener was used for this composition resulting in a runny acrylic adhesive that did not develop very good overlap shear strength to polytetrafluoroethylene and polyethylene. The remaining examples demonstrated much improved adhesion. About 20 to 40 wt. % of a polymethylmethacrylate thickener may be usefully incorporated into the compositions of the invention. Whether or not a thickener is required depends upon the selection of the acrylic monomers. If monomers of a high enough viscosity and a high enough vapor pressure are used, then a thickener may not be needed.

Examples 16 and 18 to 20 show the effect of varying the type of thickener in otherwise identical formulas. (The polymethylmethacrylate of example 18 was from a different source.) The adhesion to polyethylene and polytetrafluoroethylene changed only slightly. In addition to polymethylmethacrylate thickeners, quartz powder, fumed silica, and polystyrene-butylene may also be used. Examples 15, 21, and 22 may be similarly compared. There was little change in adhesion when these different thickeners were employed.

Examples 15, 23 and 24 show that changing the acrylate monomer from n-butylacrylate to methylacrylate or 1,1,5-trihydrooctafluoroamylacrylate did not significantly affect the overlap shear strength to polytetrafluoroethylene or polyethylene. Examples 15 and 25 illustrate that both methylmethacrylate and butylmethacrylate monomers may be successfully incorporated into polymerizable compositions according to the invention.

Examples 26 to 39 show the effect on overlap shear strength of bonds made to polytetrafluoroethylene and polyethylene as a consequence of changing the relative amounts of the methacrylate monomer, the acrylate monomer, the organoborane amine complex, the organoborane, and the thickener. Example 39 uses tributylborane rather than tripropylborane thereby evidencing that alternative alkylboranes may be used. Also demonstrated is the effect of using various acids (tin chloride, titanium chloride, hydrochloric acid, sulfuric acid, and phosphoric acid) in differing amounts. Examples 30 and 35, though differing in various aspects, each afforded excellent adhesion to both polytetrafluoroethylene and polyethylene. Polytetrafluoroethylene, a historically very difficult material to bond, showed more sensitivity to variations in the composition than did polyethylene. Varying the relative amounts of the organoborane amine complex, the organoborane, and the acid more than doubled the adhesion to polytetrafluoroethylene while having a significantly smaller effect on the adhesion to polyethylene.

Examples 40 to 42 show that in addition to the inorganic acids employed in the previous examples, various organic acids (e.g., acetic acid, acrylic acid and methacrylic acid) can also be used in the polymerizable compositions of the invention. Organic acids are preferred because they are easier to handle.

Examples 43 to 48 demonstrate the effect of preparing various adhesive compositions that do not include an organoborane amine complex. Only minimal adhesion to polyethylene and polytetrafluoroethylene was obtained.

Example 49 illustrates that when an organoborane amine complex based on monoethanolamine is included but no additional source of organoborane is provided, acceptable adhesion to polyethylene is obtained but only minimal polytetrafluoroethylene adhesion is observed. Thus, the presence of an additional source of substantially uncomplexed organoborane is needed for excellent adhesion to polytetrafluoroethylene but not polyethylene when the complex is based on monoethanolamine. The organoborane may be provided by any of the organoboranes described above in conjunction with the complex. Those organoboranes that are preferred for use in the complex are also preferred for use as the source of additional organoborane. Preferably the amount of substantially uncomplexed organoborane is about 0.1 to 7 mole % based on the number of moles of acrylic functionality, more preferably about 0.2 to 6 mole %, and most preferably about 1 to 3 mole %. However, as will be shown below, by changing the amine to 1,6-hexamethylenediamine, excellent adhesion to polytetrafluoroethylene is possible even when no additional organoborane source is provided.

Examples 50 and 51 show the result of providing adhesive compositions that include neither an organoborane amine complex nor an acid as well as the optional thickener (example 50) or the optional acrylate monomer (example 51). No adhesion to either polyethylene or polytetrafluoroethylene was obtained. The compositions of these examples included tributylborane.

The compositions of examples 52 and 53 show the effect of using too little organoborane (example 52) and too little thickener (example 53).

From the foregoing examples it can be seen that a particularly desirable polymerizable composition according to the invention comprises, based on the total weight of the composition, about 5 to 65 wt. % of an alkyl acrylate monomer (preferably butyl acrylate), about 0.5 to 5 wt. % of an organoborane amine complex (preferably a tripropylborane-monoethanolamine complex), about 0.1 to 5 wt. % of an additional organoborane (preferably tripropyl borane), about 0.5 to 5 wt. % of an acid, about 20 to 40 wt. % of a thickening agent (preferably polymethylmethacrylate), the balance (about 10 to 65 wt. %) being an alkyl methacrylate (preferably methylmethacrylate).

EXAMPLE 54

An adhesive composition that is especially well suited for bonding fluorinated polymers and polyethylene was prepared by blending 42.1 wt. % methylmethacrylate, 18.4 wt. % butylacrylate, and 37.0 wt. % of a polymethylmethacrylate thickening agent until complete dissolution occurred. 0.5 wt. % of $SnCl_4$ acid was then added followed by a mixture of 1.5 wt. % tripropylborane and 0.5 wt. % monoethanolamine. Once mixed, the composition was applied to a polyethylene substrate and a polytetrafluoroethylene substrate. The two substrates were joined, cured for 24 hours under ambient conditions, and tested for overlap shear strength according to GOST 14759-69, in the manner described above. The overlap shear strength was 5.1 MPa with substrate failure.

EXAMPLES 55 TO 75

Utilizing the weight percentages shown in Table 3 below, a series of adhesive compositions according to the invention was prepared by blending methylmethacrylate monomer, n-butyl acrylate monomer, and a polymethylmethacrylate thickening agent until complete dissolution occurred. An acid followed by an organoborane amine complex were then added with stirring. Except as noted below, the acid was methacrylic acid and the organoborane amine complex was based on tripropylborane and 1,6-hexamethylenediamine (1:1 nitrogen atom to boron atom ratio). Following the procedures of GOST 14759-69 as described above, bonded composites using polyethylene (PE), polytetrafluoroethylene (PTFE) and polyvinyl chloride (PVC) substrates (each substrate being bonded to another substrate of the same material) were prepared, cured under ambient conditions for 48 hours, and tested for overlap shear strength with the results reported in Table 3 below. Also shown in Table 3 is the failure mode of the bonded composites, as defined above.

TABLE 3

| Example No. | Wt. % Methylmethacrylate Monomer | Wt. % Butylacrylate Monomer | Wt. % Organoborane Amine Complex | Wt. % Acid | Wt. % Thickener | Shear Strength (MPa) | | | Failure Mode | | |
|---|---|---|---|---|---|---|---|---|---|---|---|
| | | | | | | PE | PTFE | PVC | PTFE | PE | PVC |
| 55 | 40.8 | 28.2 | 0.5 | 0.5 | 30.0 | 12.1 | 8.8 | 11.5 | S | S | S |
| 56 | 37.9 | 27.2 | 2.9 | 2.9 | 29.1 | 11.8 | 9.0 | 11.7 | S | S | |
| 57 | 36.2 | 25.7 | 4.8 | 4.8 | 28.6 | 11.5 | 9.3 | 11.3 | S | S | S |
| 58 | 34.6 | 24.3 | 6.5 | 6.5 | 28.0 | 10.9 | 8.4 | 10.7 | S | S | S |
| 59 | 35.6 | 28.7 | 3.0 | 3.0 | 29.7 | 12.2 | 10.1 | 11.7 | S | S | S |
| 60 | 39.8 | 30.1 | 2.9 | 2.9 | 24.3 | 10.8 | 9.5 | 10.5 | S | S | S |
| 61 | 30.0 | 27.0 | 3.0 | 3.0 | 37.0 | 11.7 | 9.7 | 11.4 | S | S | S |
| 62 | 39.3 | 13.1 | 6.5 | 6.5 | 34.6 | 11.5 | 8.1 | 10.3 | M | S | S |
| 63 | 35.6 | 38.6 | 0.5 | 0.5 | 24.8 | 10.5 | 7.8 | 9.6 | M | S | S |
| 64 | 11.8 | 52.9 | 2.9 | 2.9 | 29.4 | 11.0 | 8.9 | 10.4 | S | S | S |
| 65 | 36.9 | 28.2 | 2.9[1] | 2.9 | 29.1 | 11.2 | 9.2 | 10.8 | S | S | S |
| 66 | 36.9 | 28.2 | 2.9 | 2.9[2] | 29.1 | 10.7 | 8.4 | 10.8 | S | S | S |
| 67 | 36.9 | 28.2 | 2.9 | 2.9 | 29.1 | 12.3 | 9.9 | 11.9 | S | S | S |
| 68 | 36.9 | 28.2 | 2.9 | 2.9 | 29.1 | 10.8 | 9.3 | 11.6 | S | S | S |
| 69 | 36.9 | 28.2 | 2.9[3] | 2.9 | 29.1 | 11.2 | 9.3 | 10.1 | S | S | S |
| 70 | 36.9 | 28.2 | 2.9[4] | 2.9 | 29.1 | 11.4 | 9.0 | 10.5 | S | S | S |
| 71 | 41.5 | 27.9 | 0.4 | 0.4 | 29.9 | 5.3 | 3.2 | 4.3 | A | A | S |
| 72 | 31.2 | 24.8 | 8.3 | 8.3 | 27.5 | 1.2 | 0.7 | 1.5 | A | A | A |
| 73 | 44.7 | 30.1 | 2.9 | 2.9 | 19.4 | 3.6 | 2.3 | 3.8 | A | A | A |

TABLE 3-continued

| Example No. | Wt. % Methyl- methacrylate Monomer | Wt. % Butylacrylate Monomer | Wt. % Organoborane Amine Complex | Wt. % Acid | Wt. % Thickener | Shear Strength (MPa) | | | Failure Mode | | |
|---|---|---|---|---|---|---|---|---|---|---|---|
| | | | | | | PE | PTFE | PVC | PTFE | PE | PVC |
| 74 | 9.9 | 54.5 | 3.0 | 3.0 | 29.7 | 3.5 | 2.0 | 3.1 | A | A | A |
| 75 | 52.1 | 10.4 | 3.1 | 3.1 | 31.3 | 2.5 | 1.8 | 2.9 | A | A | A |

[1] Complex based on tri-isobutylborane and 1,6-hexamethylenediamine (nitrogen atom:boron atom ratio = 1:1)
[2] Acrylic acid
[3] Complex based on tri-n-butylborane and 1,6-hexamethylenediamine (nitrogen atom:boron atom ratio = 1:1)
[4] Nitrogen atom:boron atom ratio = 2:1.

Examples 55 to 59 show the effect on adhesion to polyethylene, polytetrafluoroethylene and polyvinylchloride as the relative amounts of methylmethacrylate monomer, butylacrylate monomer, methacrylic acid, and polymethylmethacrylate thickening agents are varied. Examples 60 to 64 make similar comparisons and also vary the amount of complex.

Examples 65 to 70 demonstrate the results of varying the organoborane amine complex, the acid and the thickening agent. In example 65 the organoborane amine complex is based on tri-isobutylborane and 1,6-hexamethylenediamine at a 1:1 nitrogen atom to boron atom ratio. In example 66, the acid is acrylic acid. Examples 67 and 68 employ polymethylmethacrylate thickening agents from different sources.

Example 69 uses an alkylborane amine complex based on tri-n-butylborane and 1,6-hexamethylenediamine (nitrogen atom to boron atom ratio=1:1) The organoborane amine complex of example 70 is based on tripropylborane and 1,6-hexamethylenediamine but at a nitrogen atom to boron atom ratio of 2:1.

Examples 71 and 72 show the effect of having too little or too much complex and too little or too much acid in the adhesive composition. Example 73 illustrates that poor adhesion is obtained when insufficient thickening agent is employed. Consequently the adhesive composition of example 73 was too low in viscosity and began to oxidize prematurely. Example 73 may be contrasted with example 15 where the presence of additional organoborane overcomes the premature oxidation. Example 74 demonstrates the use of a relatively small amount of methacrylate monomer with a relatively large amount of acrylate monomer. Example 75 shows the opposite relationship.

From the foregoing examples it can be seen that a particularly desirable polymerizable composition according to the invention comprises, based on the total weight of the composition, about 10 to 55 wt. % of an alkyl acrylate (preferably butyl acrylate), about 10 to 50 wt. % of an alkyl methacrylate (preferably methyl methacrylate), about 0.5 to 7 wt. % of an organoborane amine complex (preferably a tripropylborane-1,6-hexamethylenediamine complex), about 0.5 to 5 wt. % of an acid (preferably acrylic or methacrylic acid), and about 25 to 40 wt. % of a thickening agent (preferably polymethylmethacrylate).

EXAMPLES 76 TO 98

Examples 76 to 98 illustrate another preferred way in which the polymerization initiator systems of the invention may be used. In these examples, the substrates to be bonded were pretreated (e.g., by spraying or brushing) with a primer that comprised an organoborane amine complex in an organic solvent. Once applied, the primer solvent was evaporated and a polymerizable acrylic adhesive composition was then applied. The substrates were then mated and allowed to cure for 24 to 48 hours before they were tested for overlap shear strength following the procedures of GOST 14759-69, as described above. The results of these tests using polyethylene (PE), polyvinylchloride (PVC) and polytetrafluoroethylene (PTFE) substrates, each substrate bonded to a second substrate of the same material, are reported below in Table 4. The "exposure time" refers to the time for which the primer was exposed to air after having been applied to a substrate and before the adhesive was applied.

More specifically, and unless otherwise noted below: the organoborane amine complex was based on tripropylborane and 1,6-hexamethylenediamine at a nitrogen atom to boron atom ratio (N:B) of 1:1.; the complex was dissolved in pentane (solvent) to a 10% solution; and the polymerizable adhesive comprised 39 wt. % methylmethacrylate monomer, 35 wt. % butylacrylate monomer, 1 wt. % methacrylic acid, and 25 wt. % of a polymethylmethacrylate thickening agent.

TABLE 4

| Example No. | Primer Composition Remarks | Exposure Time (Min.) | Shear Strength (MPa) | | |
|---|---|---|---|---|---|
| | | | PE | PVC | PTFE |
| 76 | 5% Solution | 1.0 | 9.4 | 8.2 | 8.2 |
| 77 | 8% Solution | 10 | 10.1 | 8.8 | 9.5 |
| 78 | No Remarks | 10 | 10.2 | 8.2 | 9.4 |
| 79 | 12% Solution | 10 | 10.3 | 8.7 | 9.6 |
| 80 | No Remarks | 30 | 12.1 | 9.1 | 9.6 |
| 81 | No Remarks | 60 | 11.3 | 8.8 | 9.5 |
| 82 | No Remarks | 120 | 10.8 | 8.9 | 9.4 |
| 83 | No Remarks | 180 | 10.5 | 8.7 | 9.8 |
| 84 | No Remarks | 360 | 9.8 | 8.5 | 8.5 |
| 85 | No Remarks | 420 | 9.7 | 8.6 | 8.3 |
| 86 | No Remarks | 480 | 5.7 | 5.3 | 4.3 |
| 87 | N:B = 2.5:1 | 20 | 9.8 | 8.5 | 8.4 |
| 88 | N:B = 2:1 | 20 | 10.1 | 8.2 | 8.7 |
| 89 | N:B = 1.3:1 | 20 | 10.5 | 8.8 | 9.1 |
| 90 | N:B = 0.9:1 | 20 | 9.7 | 8.4 | 8.9 |
| 91 | Complex uses tri-isobutylborane and 1,6-hexamethylene diamine | 20 | 11.3 | 8.9 | 9.5 |
| 92 | Complex uses tri-isobutylborane and 1,6-hexamethylene diamine, N:B = 2:1 | 20 | 10.3 | 8.0 | 8.5 |
| 93 | Hexane solvent | 20 | 11.5 | 8.9 | 9.1 |

TABLE 4-continued

| Example No. | Primer Composition Remarks | Exposure Time (Min.) | Shear Strength (MPa) | | |
|---|---|---|---|---|---|
| | | | PE | PVC | PTFE |
| 94 | Petroleum ether solvent | 20 | 11.3 | 8.7 | 9.0 |
| 95 | White spirits solvent | 20 | 11.1 | 8.6 | 9.2 |
| 96 | Benzene solvent | 20 | 10.9 | 8.4 | 9.5 |
| 97 | Toluene solvent | 20 | 11.0 | 8.5 | 8.7 |
| 98 | Butylacetate solvent | 20 | 10.7 | 8.3 | 8.4 |

Examples 76 to 79 illustrate that primer solution concentrations of about 5% to 12% may be used in accordance with the invention. Examples 78 and 80 to 86 indicate that once the primer has been applied, the primed substrate can be left exposed to the air for up to at least 7 hours without detrimentally affecting the strength of the subsequent adhesive bond. In examples 78 and 87 to 90 the nitrogen atom to boron atom ratio in the organoborane amine complex was varied from 0.9:1 to 2.5:1 without adversely affecting adhesion.

Examples 91 and 92 indicate that useful organoborane amine complexes can be prepared from tri-isobutylborane and 1,6-hexamethylenediamine. Examples 93 to 98 illustrate the wide variety of useful organic solvents that may be employed in preparing primer compositions according to the invention.

EXAMPLES 99 TO 106

Examples 99 to 106 further illustrate the provision and use of primers according to the invention. Primers were prepared and applied as described in conjunction with examples 76 to 98 (tripropylborane and 1,6-hexamethylenediamine in pentane). The ratio of nitrogen atoms to boron atoms (N:B) was 1:1 except in example 99 (N:B=4:1) and example 100 (N:B=0.8:1). The concentration of the primer solution, the exposure time, the "cure time" (i.e., the time over which the bonded composites were cured before testing), and the overlap shear strength test results (based on GOST 14759-69) are all reported in Table 5 below.

The bonded composites were prepared as described in conjunction with Examples 76 to 98 and using the adhesive composition of these examples.

TABLE 5

| Example No. | Concentration of Primer Solution (wt. %) | Exposure Time (Min.) | Cure Time | Shear Strength (MPa) | | |
|---|---|---|---|---|---|---|
| | | | | PE | PVC | PTFE |
| 99 | 10 | 20 | 24 hrs. | 2.1 | 2.3 | 1.7 |
| 100 | 10 | 20 | 24 hrs. | 2.5 | 2.7 | 1.9 |
| 101 | 3 | 20 | 24 hrs. | 3.2 | 2.5 | 1.3 |
| 102 | 15 | 20 | 24 hrs. | 5.6 | 4.9 | 4.1 |
| 103 | 15 | 420 | 60 hrs. | 9.6 | 8.5 | 8.4 |
| 104 | 15 | 420 | 10 days | 9.7 | 8.4 | 8.3 |
| 105 | 15 | 420 | 30 days | 9.8 | 8.2 | 8.5 |
| 106 | 15 | 420 | 6 months | 9.5 | 8.3 | 8.6 |

Example 99 shows the effect on adhesion when the nitrogen atom to boron atom ratio is too high (4:1) and example 100 shows the effect when the ratio is too low (0.8:1). The ratio should be in the range of about 1:1 to 2:1, more preferably about 1:1 to less than 2:1, even more preferably about 1:1 to 1.5:1, and most preferably about 1:1.

Example 101 shows that reduced adhesion results from using a primer having a reduced concentration of the organoborane amine complex. Adhesion improved significantly when the primer solution concentration was increased from 3% (example 101) to 15% (example 102).

Examples 103 through 106 demonstrate that the primer solutions of the invention can be exposed to air (after application to a substrate) for up to at least 7 hours without adversely affecting subsequently made adhesive bonds. The adhesive bonds show no significant diminution in shear strength even after aging for 6 months before testing.

EXAMPLES 107 TO 110

Examples 107 to 110 illustrate the effect of using a primer with a polymerizable acrylic composition that also contains an organoborane amine complex.

In examples 107 and 108 a 10% primer solution comprising a tripropylborane-1,6-hexamethylenediamine complex in pentane was applied to polyethylene (PE), polyvinylchloride (PVC) and polytetrafluoroethylene (PTFE) substrates as described in conjunction with examples 99 to 106. A polymerizable acrylic adhesive comprising 44.1 wt. % methylmethacrylate monomer, 29.4 wt. % butylacrylate monomer, 3.0 wt. % methacrylic acid, 20 wt. % polymethylmethacrylate thickening agent, 0.5 wt. % tripropylborane, and 3.0 wt. % tripropylborane-monoethanolamine complex (N atom:B atom ratio=1:1) was prepared and allowed to remain in the mixing vessel for a period of time referred to in Table 6 below as the "Pot Time." The acrylic adhesive composition was then applied to the primed substrates. In each example the acrylic adhesive was applied 10 minutes after the primer had been applied. Bonded composites were prepared, cured, and tested according to GOST 14759-69 and Table 6 below. The overlap shear strength test results are also reported in Table 6.

Examples 109 and 110 were prepared and tested in the same manner except that no primer was applied to the substrates.

TABLE 6

| Example No. | Primer Applied | Pot Time (Min.) | Shear Strength (MPa) | | |
|---|---|---|---|---|---|
| | | | PE | PVC | PTFE |
| 107 | Yes | 20 | 10.3 | 8.7 | 8.4 |
| 108 | Yes | 30 | 10.5 | 9.1 | 8.7 |
| 109 | No | 20 | 1.0 | 0.8 | 0.0 |
| 110 | No | 5 | 10.5 | 3.2 | 0.0 |

Examples 107 to 110 show that the use of a primer according to the invention can extend the working life of compositions that also include a polymerization initiator. The useful working life of the adhesive of examples 109 and 110 was between 5 and 20 minutes for polyethylene and polyvinylchloride and less than 5 minutes for polytetrafluoroethylene. However, with the use of a primer, the working life could be extended to more than 30 minutes.

EXAMPLES 111 TO 114

Examples 111 to 114 are similar to examples 107 to 110 except using a different primer and a different adhesive. The primer of these examples (applied only in examples 111 and 112) is similar to that of examples 107 and 108 except that the nitrogen atom to boron atom ratio is 1.3:1. The exposure time was 60 minutes. The polymerizable acrylic adhesive comprised 40.8 wt. % methylmethacrylate monomer, 27.2 wt. % butylacrylate monomer, 1.0 wt. % methacrylic acid, 30.0 wt. % polymethylmethacrylate thickening agent, and 1.0 wt. % of a tripropylborane-1,6-hexamethylenediamine complex (nitrogen atom:boron atom ratio=1:1). Bonded composites were prepared and tested as described above in examples 107 to 110 with the results reported below in Table 7.

TABLE 7

| Example No. | Primer Applied | Pot Time (Min.) | Shear Strength (MPa) | | |
|---|---|---|---|---|---|
| | | | PE | PVC | PTFE |
| 111 | Yes | 60 | 10.7 | 8.4 | 8.4 |
| 112 | Yes | 120 | 10.3 | 8.1 | 8.7 |
| 113 | No | 20 | 0.9 | 1.2 | 0.7 |
| 114 | No | 5 | 12.1 | 8.8 | 11.5 |

With the use of a primer, the working life of the adhesive compositions of these examples could be extended from less than 20 minutes to more than 2 hours.

EXAMPLES 115 AND 116

A series of polymerizable acrylic monomer compositions was prepared to evaluate the utility of different amines in providing the organoborane amine complex. Each composition comprised 19.2 wt. % n-butylacrylate, 55.3 wt. % methylmethacrylate, 22.4 wt. % polymethylmethacrylate thickening agent, 0.8 wt. % methacrylic acid, and 2.2 wt. % of a tripropylborane amine complex having a nitrogen atom to boron atom ratio of 1:1. The various amines used along with the overlap shear strength test results on polyethylene (PE) and polytetrafluoroethylene (PTFE) (24 hour cure) are shown below in Table 8.

TABLE 8

| Example No. | Amine | Shear Strength (MPa) | |
|---|---|---|---|
| | | PE | PTFE |
| 115 | Aniline | 1.5 | 0 |
| 116 | Triethylamine | 10.9 | 0 |

These examples did not demonstrate any adhesion to polytetrafluoroethylene. Moreover, the organoborane amine complexes were pyrophoric when tested according to the charring time and ignition time tests described above and hence were considered unsuitable.

EXAMPLES 117 AND 118

Two polymerizable compositions containing a methacrylate monomer but no acrylate monomer were prepared as shown below in Table 9. In each example the methacrylate monomer was methylmethacrylate, the thickening agent was polymethylmethacrylate, the acid was methacrylic acid, and the organoborane amine complex was based on hexamethylenediamine and tripropylborane (nitrogen atom to boron atom ratio=1:1). Bonded composites using polyethylene and polytetrafluoroethylene were prepared as described above and cured for 24 hours under ambient conditions before testing for overlap shear strength, as shown in Table 9.

TABLE 9

| Example No. | Wt. % Methyl Methacrylate | Wt. % Acid | Wt. % Organoborane amine complex | Wt. % Thickener | Shear Adhesion (MPa) | |
|---|---|---|---|---|---|---|
| | | | | | PE | PTFE |
| 117 | 52.2 | 6.6 | 6.6 | 34.6 | 10.7 | 2.3 |
| 118 | 56.3 | 3.2 | 3.2 | 37.4 | 0 | 0 |

Examples 117 and 118 show that in polymerizable compositions comprising only methacrylate monomer it may be necessary to use additional organoborane amine complex and acid to achieve acceptable adhesion to polyethylene and polytetrafluoroethylene.

EXAMPLES 119 AND 120

Examples 119 and 120 describe additional ways in which primers according to the invention may be provided. Example 119 comprised 0.5 wt. % bis(tri-butylperoxy) triphenylantimony, 73.1 wt. % methylmethacrylate monomer and 25.4 wt. % butylacrylate monomer. The resulting composition was degassed and then 1.0 wt. % of tripropylboron was added thereto. A polytetrafluoroethylene coupon was then primed with this composition and bonded to a like coupon with a polyurethane adhesive. The overlap shear strength (when tested as described above) was 6.3 MPa. An unprimed control example showed no adhesion. The peroxide provides a source of oxygen since the composition was degassed. If the composition had not been degassed, atmospheric oxygen would have sufficed as the oxygen source and the addition of peroxide would have been unnecessary.

In example 120, a polyethylene coupon was primed with a composition comprising 39 wt. % methylmethacrylate, 25 wt. % n-butylacrylate, 30 wt. % polymethylmethacrylate, 3 wt. % of an organoborane amine complex (1,6-hexamethylenediamine and tripropylborane at a 1:1 nitrogen atom to boron atom ratio), and 3 wt. % methacrylic acid. When bonded to a like substrate with an epoxy adhesive, the bonded composite exhibited an overlap shear strength (when tested as described above) of 6.0 MPa. An unprimed control example showed no adhesion.

Thus compositions comprising an acrylic monomer, an organoborane, and an oxygen source or comprising an acrylic monomer, an organoborane amine complex, and an acid can be used to prime fluoroplastics for improved adhesion to subsequently applied adhesives.

EXAMPLES 121 TO 125

Examples 121 to 125 show the effect of the nitrogen atom to boron atom ratio (N:B) on the performance of polymerizable acrylic compositions according to the invention. A series of organoborane amine complexes based on 1,6-hexamethylenediamine and tri-n-butylborane at various nitrogen atom to boron atom ratios (as shown below in Table 10) was prepared. 0.186 g of the complex was added to 5 g a polymerizable acrylic composition made from 78 g methylmethacrylate monomer, 56 g 2-butylacrylate monomer, 60 g of a medium molecular weight polymethylmethacrylate thickening agent, and 6 g of methacrylic acid.

Bonded composites based on polyethylene (PE), polypropylene (PP), and polytetrafluoroethylene (PTFE) (each substrate bonded to a substrate of the same material) having a 161 mm$^2$ overlap area and 0.15 mm bondline thickness were prepared, fixtured with adhesive tape and binder clips, and cured under ambient conditions for 24 hours. The substrates measured about 25 mm×100 mm×3 mm thick. The bonded composites were then tested to failure in a tensile testing machine using a crosshead speed of 2.5 mm per minute. Results are shown below in which the reported values are an average of 3 samples. Examples 121 and 122 demonstrated substrate failure. The remaining examples failed adhesively.

TABLE 10

| Example No. | N:B | Overlap Shear Strength (MPa) | | |
|---|---|---|---|---|
| | | PE | PP | PTFE |
| 121 | 1:1 | 4.9 | 4.1 | 1.9 |
| 122 | 1.5:1 | 5.3 | 3.0 | 1.4 |
| 123 | 2:1 | 2.4 | 2.5 | 0.3 |
| 124 | 3:1 | 0.3 | 0.1 | 0.0 |
| 125 | 4:1 | 0.3 | 0.2 | 0.0 |

These examples show the surprising and unexpected improvement in adhesion to various low energy substrates that is possible when using the polymerizable compositions of the invention.

Numerous variations and modifications are possible within the scope of the foregoing specification without departing from the spirit of the invention which is defined in the accompanying claims.

What is claimed is:

1. A bonded composite comprising a first substrate, a second substrate, and a polymerized acrylic composition that adhesively bonds the first and second substrates together wherein the acrylic composition is the polymerization product of a polymerizable acrylic system that comprised:
   (a) at least one acrylic monomer;
   (b) an effective mount of an organoborane amine complex having the structure:

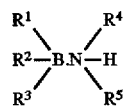

wherein:
   $R^1$ is an alkyl group having 1 to 10 carbon atoms;
   $R^2$ and $R^3$ are independently selected from the group consisting of alkyl groups having 1 to 10 carbon atoms and phenyl-containing groups;
   $R^4$ is selected from the group consisting of $CH_2CH_2OH$ and $(CH_2)_3NH_2$ wherein x is an integer greater than 2;
   $R^5$ is hydrogen or an alkyl group having 1 to 10 carbon atoms; and
   the nitrogen atom to boron atom ratio is about 1:1 to 1.5:1; and
   (c) an effective mount of an acid for initiating polymerization of the acrylic monomer.

2. A bonded composite according to claim 1 wherein the first substrate has a low surface energy.

3. A bonded composite according to claim 2 wherein the first substrate is selected from the group of materials consisting of a polyethylene, a polypropylene, a polyvinylchloride and a fluoroplastic.

4. A bonded composite according to claim 1 wherein both the first and second substrates have a low surface energy.

5. A bonded composite according to claim 4 wherein both the first and second substrates are independently selected from the group consisting of a polyethylene, a polypropylene, a polyvinylchloride and a fluoroplastic.

6. A bonded composite according to claim 1 wherein $R^1$, $R^2$ and $R^3$ are each independently selected from the group consisting of alkyl groups having 2 to 5 carbon atoms.

7. A bonded composite according to claim 6 wherein $R^4$ is selected from the group consisting of $CH_2CH_2OH$ and $(CH_2)_xNH_2$ wherein x is an integer from 2 to 6 and further wherein $R^5$ is hydrogen.

8. A bonded composite according to claim 7 wherein $R^4$ is selected from the group consisting of $CH_2CH_2OH$ and $(CH_2)_6NH_2$.

9. A bonded composite according to claim 8 wherein $R^1$, $R^2$ and $R^3$ are each $CH_2CH_3$, and $R^4$ is $(CH_2)_6NH_2$.

10. A bonded composite according to claim 1 wherein the nitrogen atom to boron atom ratio in the polymerizable acrylic system is about 1:1.

11. A bonded composite according to claim 1 wherein the at least one acrylic monomer in the polymerizable acrylic system is a blend of an alkyl acrylate monomer and an alkyl methacrylate monomer.

12. A bonded composite according to claim 11 wherein the alkyl acrylate monomer is a butyl acrylate and the alkyl methacrylate monomer is methyl methacrylate.

13. A bonded composite according to claim 1 wherein the organoborane amine complex comprises about 0.15 to 5 mole %, based on the number of moles of acrylic functionality in the polymerizable acrylic system.

14. A bonded composite according to claim 1 wherein the polymerizable acrylic system further comprises a thickening agent for increasing the viscosity thereof.

15. A bonded composite according to claim 1 wherein $R^4$ is $CH_2CH_2OH$, the polymerizable acrylic system further comprising about 0.1 to 7 mole %, based on the number of moles of acrylic functionality, of a substantially uncomplexed trialkylborane.

16. A bonded composite according to claim 1 wherein the polymerizable acrylic system comprised:
   (a) about 0.5 to 7 wt. % of the organoborane complex, wherein $R^1$, $R^2$ and $R^3$ are independently selected from the group consisting of alkyl groups having 2 to 5 carbon atoms, $R^4$ is $(CH_2)_6NH_2$, and $R^5$ is hydrogen;
   (b) about 0.5 to 7 wt. % of the acid, wherein the acid is either acrylic acid or methacrylic acid;
   (c) a blend of (i) a butyl acrylate that provided about 10 to 55 wt. % and (ii) methyl methacrylate that provided about 10 to 50 wt. %; and
   (d) about 25 to 40 wt. % of a thickening agent;
   wherein the sum of a+b+c+d equals 100 wt. %.

17. A bonded composite according to claim 16 wherein the polymerizable acrylic system comprised at least 0.027 weight % boron.

18. A bonded composite according to claim 13 wherein the polymerizable acrylic system comprised:
   (a) about 0.5 to 5 wt. % of the organoborane amine complex, wherein $R^1$, $R^2$ and $R^3$ are independently selected from the group consisting of alkyl groups having 2 to 5 carbon atoms and further wherein $R^4$ is $CH_2CH_2OH$;
   (b) about 0.5 to 5 wt. % of the acid;
   (c) a blend of (i) an alkyl acrylate that provided about 5 to 65 wt. % and (ii) about 10 to 65 wt. % of an alkyl methacrylate;
   (d) about 0.1 to 5 wt. % of a substantially uncomplexed trialkylborane, the alkyl groups of which may be the same or different, each having 1 to 10 carbon atoms; and (e) about 20 to 40 wt. % of a thickening agent;
wherein the sum of a+b+c+d+e equals 100 wt. %.

19. A bonded composite according to claim 13 wherein the polymerizable acrylic system comprised at least 0.027 weight % boron.

20. A bonded composite according to claim 13 wherein the polymerizable acrylic system further comprises an elastomeric filler.

* * * * *

UNITED STATES PATENT AND TRADEMARK OFFICE
CERTIFICATE OF CORRECTION

PATENT NO. : 5,691,065  
DATED : November 25, 1997  
INVENTOR(S) : Jury V. Zharov, Jury N. Krasnov (deceased)

Page 1 of 1

It is certified that error appears in the above-identified patent and that said Letters Patent is hereby corrected as shown below:

<u>Title page,</u>
Item [57] Abstract, "Rhu" should read -- $R^4$ --.

<u>Page 2, OTHER PUBLICATIONS,</u>
Second Column, Lines 48 and 49, "Vin-Ichloride" should read -- Vinylchloride --.

<u>Columns 17 and 18,</u>
Table 3, Example No. 67, under Shear Strength (Mpa)/PVC, "11.9" should read -- 11.0 --.

<u>Column 20, Table 4,</u>
Example No. 76, under Exposure Time (Min.), "1.0" should read -- 10 --.

<u>Column 25,</u>
Line 51, "$(CH_2)_3NH_2$" should read -- $(CH_2)_xNH_2$ --.

<u>Column 26,</u>
Line 53, "claim 13" should read -- claim 1 --.

<u>Column 27,</u>
Line 3, "claim 13" should read -- claim 1 --.

<u>Column 28,</u>
Line 1, "claim 13" should read -- claim 1 --.

Signed and Sealed this

Sixteenth Day of October, 2001

*Attest:*

NICHOLAS P. GODICI  
*Attesting Officer*    Acting Director of the United States Patent and Trademark Office